(12) United States Patent
Goren et al.

(10) Patent No.: US 6,476,649 B1
(45) Date of Patent: Nov. 5, 2002

(54) DRIVER OUTPUT SWING CONTROL USING A MIRROR DRIVER

(75) Inventors: David Goren, Nesher (IL); Donald J Papae, Hopewell Jct., NY (US); Michael Zelikson, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/715,423

(22) Filed: Nov. 17, 2000

(51) Int. Cl.$^7$ ............................................. H03K 3/00
(52) U.S. Cl. ..................................... 327/108; 327/563
(58) Field of Search ...................... 327/108–112, 379, 327/389, 391, 427, 434, 563

(56) References Cited

U.S. PATENT DOCUMENTS

| | | | |
|---|---|---|---|
| 4,806,791 A | 2/1989 | Mizuide | 327/65 |
| 5,136,183 A | 8/1992 | Moyal et al. | 327/65 |
| 5,471,168 A * | 11/1995 | Sevenhans et al. | 327/103 |
| 5,760,618 A * | 6/1998 | Deliyannides et al. | 327/108 |
| 5,892,374 A | 4/1999 | Fiedler | 327/65 |
| 5,955,899 A | 9/1999 | Afghahi | 327/65 |
| 6,081,140 A | 6/2000 | King | 327/65 |
| 6,232,803 B1 * | 5/2001 | Nguyen | 327/63 |

OTHER PUBLICATIONS

Takashi Sekino et al., "Ultra Hi–Speed Pin–Electronics and Test Station Using GaAs IC", International Test Conference 1994, Paper 29.1, pp. 683–690.
DUO™ System Description, Credence Systems Corp., 1995, pp. 1–5, 7–11, 37–39, and 74.
Adel S. Sedra et al., *Microelectronic Circuits,* Oxford Series in Electrical Engineering, Oxford Univ. Press, Second Edition, Jun. 1997, pp. 506–512, ISBN 0195116631.

* cited by examiner

Primary Examiner—Kenneth B. Wells
(74) Attorney, Agent, or Firm—Darby & Darby

(57) ABSTRACT

Instrumentation driver apparatus, including a main driver, coupled to receive an alternating input signal and having a main circuit structure, which is adapted to generate, in response to the alternating input signal, a main output signal with alternating voltage. The apparatus includes a mirror driver, coupled to receive a direct voltage input and having a mirror circuit structure located in proximity to the main circuit structure, which is adapted to generate a mirror output signal in response to the direct voltage input, such that a variation in an operating condition of the main driver causes a corresponding variation in the mirror output signal. The apparatus further includes a feedback circuit, coupled to receive the mirror output signal, which provides in response to the mirror output signal a feedback stabilization input to the main driver so as to stabilize the main output signal.

16 Claims, 6 Drawing Sheets

DRIVER OUTPUT SWING CONTROL USING A MIRROR DRIVER

FIELD OF THE INVENTION

The present invention relates generally to instrumentation equipment, and specifically to high-accuracy drivers for automatic testing equipment.

BACKGROUND OF THE INVENTION

Present-day very large scale integrated (VLSI) circuits are routinely rated at operating frequencies of the orders of hundreds of MHz. Testing systems for these circuits must of necessity be able to switch significantly faster than the rate of the systems they are testing, so that the testing system is not a limiting factor in the testing process. The testing systems must also be able to apply accurate voltage levels to circuits being tested. Thus testing systems which are able to switch at high frequency rates of at least 1 GHz or even several GHz, and which are also able to accurately control the voltage swings of the signals, are necessary.

Figure 1:
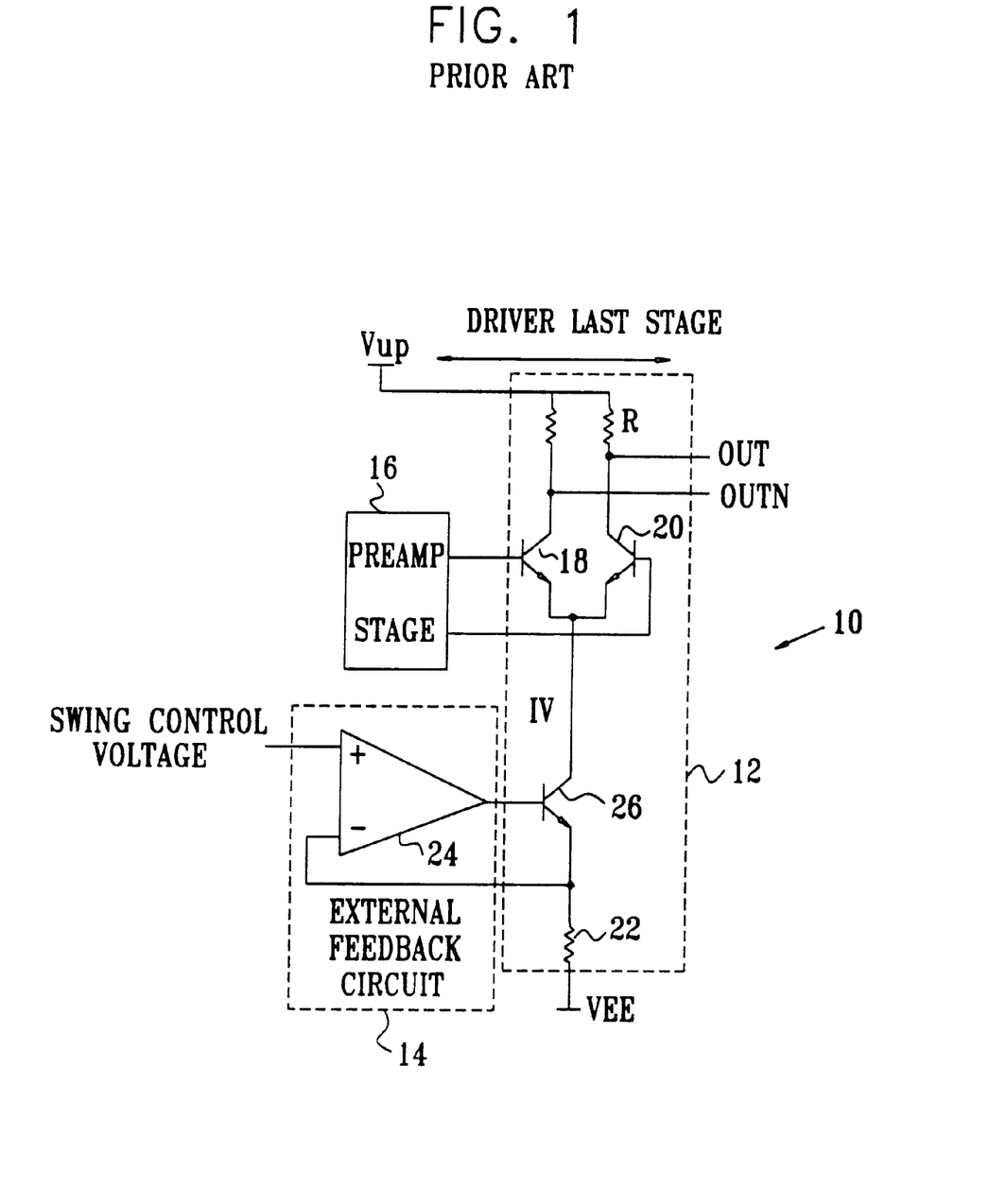
FIG. 1 is a schematic electronic diagram of an instrumentation driver known in the art.

FIG. 1 is a schematic electronic diagram of a last stage 10 of an automatic test equipment (ATE) driver, as is known in the art, for producing signals comprising high-frequency controlled voltage swings. System 10 comprises a driver 12 and an external feedback circuit 14. Driver 12 receives opposite phase switching signals from a preamplifier 16. The preamplifier output signals are applied to the respective gates of differential pair transistors 18 and 20, comprised in driver 12, which have their emitters coupled together in an emitter coupled logic (ECL) stage. Transistors 18 and 20 generate opposite phase output signals OUT and OUTN at their collectors. Both outputs have a swing between controlled upper and lower levels as explained below.

The collector of a control transistor 26 is connected to the coupled emitters of transistors 18 and 20, so that transistor 26 acts to control the current through transistors 18 and 20, and thus the upper and lower levels of OUT and OUTN. The emitter of transistor 26 is connected in series with a reference resistor 22, and a reference voltage is measured across the resistor for use by feedback circuit 14.

Feedback circuit 14 comprises an operational amplifier 24, which reads the reference voltage generated across resistor 22 and feeds the voltage, via the inverting input of the amplifier, to the gate of control transistor 26. Amplifier 24 also receives at its non-inverting input a swing control voltage which sets the swing voltage, i.e., the peak-peak voltage, of signals OUT and OUTN.

Typically, some or all components of last stage 10 are built on a single chip, although some or all of the components may be off-chip and/or discrete components. Furthermore, each of transistors 18, 20, and 26 may be replaced by a respective plurality of transistors in parallel, in order to increase the current that can be passed in each of the respective paths. Alternatively or additionally, the emitter area of transistors in the path is increased so as to increase the current carrying capacity. Preferably, transistors 18, 20, and 26, or the respective pluralities replacing the transistors, are bipolar. However, the basic concepts of the operation of the last stage also apply if the transistors are CMOS transistors. Most preferably, the bipolar transistors are implemented in silicon-germanium, or other heterostructure technology. Preferably, amplifier 24 is an operational amplifier implemented from conventional bipolar or MOSFET transistors.

The accuracy of the feedback loop of systems such as last stage 10 is limited because intrinsic variations in parameters within driver 12 can only be indirectly sensed by the external feedback circuit. The variations, such as changes in current gain, base-emitter voltage, or modulation of the base width (the Early effect) of transistors 18, 20, and 26, can not be properly sensed by the external circuit.

SUMMARY OF THE INVENTION

In preferred embodiments of the present invention, an instrumentation driver comprises both a main driver and a mirror driver, preferably connected by a feedback amplifier. The main driver receives an input alternating signal, and generates a corresponding alternating output signal. The mirror driver receives a substantially fixed voltage, and generates a corresponding, approximately-fixed output signal. The mirror driver is subject to substantially the same intrinsic variations in operating conditions and voltage levels as is the main driver. The mirror driver effectively senses these variations and cooperates with the feedback amplifier to stabilize the output alternating signal of the main driver. Thus, the instrumentation driver achieves significantly higher accuracy in its high-speed, alternating output signals than do instrumentation drivers known in the art.

The mirror driver is implemented to have electrical properties substantially similar to those of the main driver, and is maintained in the same operating environment as the main driver. Preferably, at least some stages of the main driver and corresponding stages the mirror driver are implemented using substantially the same numbers of corresponding elements. The approximately-fixed output signal from the mirror driver is used as an input to the feedback amplifier, so that the mirror driver and the amplifier together comprise a feedback path or the main driver.

Since the main driver and the mirror driver have substantially similar electrical properties and are in the same environment, variations in parameters of the main driver and variations in corresponding parameters of the mirror driver will be substantially similar. Since the mirror driver is in the feedback path, variations in the main driver, which do not directly show in the feedback path of prior art instrumentation drivers, are directly incorporated into the feedback path of preferred embodiments of the present invention. These factors contribute to the high accuracy of output signals that the present instrumentation driver achieves.

In some preferred embodiments of the present invention, the main driver and mirror driver are both driven by substantially similar preamplifiers operating in the same environment, so that variations in corresponding parameters of the preamplifiers are also substantially similar. The main driver preamplifier receives an alternating signal from an external source, and generates a corresponding alternating signal as an input to the main driver. The mirror driver preamplifier receives a substantially fixed voltage, and generates, as an input to the mirror driver, a corresponding approximately fixed voltage which reflects changes in the environment of the driver preamplifier.

In some preferred embodiments of the present invention, the mirror driver preamplifier is a simplified version of the main driver preamplifier. The simplified mirror driver preamplifier duplicates the conditions at the output of the main driver preamplifier.

There is therefore provided, according to a preferred embodiment of the present invention, instrumentation driver apparatus, including:

a main driver, coupled to receive an alternating input signal and having a main circuit structure, which is adapted to generate, responsive to the alternating input signal, a main output signal with alternating voltage;

a mirror driver, coupled to receive a direct voltage input and having a mirror circuit structure located in proximity to the main circuit structure, and adapted to generate a mirror output signal responsive to the direct voltage input, such that a variation in an operating condition of the main driver causes a corresponding variation in the mirror output signal; and a feedback circuit, coupled to receive the mirror output signal and to provide, responsive thereto, a feedback stabilization input to the main driver so as to stabilize the main output signal.

Preferably, the feedback circuit includes an amplifier which is coupled to receive a swing control voltage and to vary the main output signal responsive thereto.

Further preferably, the feedback circuit is coupled to provide the feedback stabilization input to the mirror driver.

Preferably, the main circuit structure includes a plurality of main elements, and the mirror circuit structure includes a corresponding plurality of mirror elements coupled in a substantially similar manner to the plurality of main elements included in the main circuit structure.

Preferably, the apparatus includes:

a main driver preamplifier which supplies the alternating input voltage to the main driver; and a mirror driver preamplifier which supplies the direct voltage input to the mirror driver, wherein the main driver preamplifier is implemented in a substantially similar environment to that of the mirror driver preamplifier, such that a variation in an operating condition of the main driver preamplifier causes a corresponding variation in the mirror output signal.

Further preferably, the main driver preamplifier includes a plurality of stages including a main power output stage, and the mirror driver preamplifier includes a mirror power output stage substantially similar in number of elements and coupling of the elements to the main power output stage.

Further preferably, the mirror driver preamplifier includes a plurality of mirror elements coupled in a substantially similar manner to coupling of a corresponding plurality of main elements included in the main driver preamplifier.

Further preferably, the main driver preamplifier is coupled to receive an overshoot feedback input in order to limit an overshoot in the main output signal.

Preferably, the main output signal includes signals having frequencies greater than approximately 1 GHz.

Preferably, the main output signal includes substantially rectangular signals having a transit time between an upper and a lower level less than approximately 200 ps.

Preferably, the main output signal includes substantially rectangular signals including an upper level and a lower level having an accuracy of the order of 10 mV or less.

Preferably, the main circuit structure includes a main differential pair of transistors which provide the main output signal at a collector of one of the pair of transistors.

Further preferably, the mirror circuit structure includes a mirror differential pair of transistors having substantially similar characteristics to the main differential pair of transistors.

Further preferably the main differential pair of transistors include respective pluralities of transistors coupled in parallel.

Further preferably, the mirror circuit structure includes a non-differential transistor which is coupled in a substantially similar manner and which has substantially similar characteristics to one of the plurality of transistors coupled in parallel.

Preferably, the apparatus is constructed so that at least some elements of the mirror circuit structure operate in a substantially similar environment to that of at least some elements of the main circuit structure.

Further preferably, the environment includes a single chip containing the at least some elements of the mirror circuit structure together with the at least some elements of the main circuit structure.

There is further provided, according to a preferred embodiment of the present invention, instrumentation driver apparatus, including:

a first main driver, coupled to receive a first alternating input signal and having a first main circuit structure, which is adapted to generate, responsive to the first alternating input signal, a first main output signal with alternating voltage;

a first mirror driver, coupled to receive a first direct voltage input and having a first mirror circuit structure located in proximity to the first main circuit structure, and adapted to generate a first mirror output signal responsive to the first direct voltage input, such that a variation in an operating condition of the first main driver causes a corresponding variation in the first mirror output signal;

a first feedback circuit, coupled to receive the first mirror output signal and to provide, responsive thereto, a first feedback stabilization input to the first main driver so as to stabilize the first main output signal;

a second main driver, coupled to receive a second alternating input signal and having a second main circuit structure substantially similar to the first main circuit structure, which is adapted to generate, responsive to the second alternating input signal, a second main output signal with alternating voltage;

a second mirror driver, coupled to receive a second direct voltage input and having a second mirror circuit structure substantially similar to the first mirror circuit structure, located in proximity to the second main circuit structure, and adapted to generate a second mirror output signal responsive to the second direct voltage input, such that a variation in an operating condition of the second main driver causes a corresponding variation in the second mirror output signal; and a second feedback circuit, coupled to receive the second mirror output signal and to provide, responsive thereto, a second feedback stabilization input to the second main driver so as to stabilize the second main output signal, so that the first main driver, the first mirror driver, and the first feedback circuit, are electrically independent of the second main driver, the second mirror driver, and the second feedback circuit, and so that the first main output signal and the second main output signal are combined to form a tri-level output.

Preferably, the apparatus includes a power supply which powers the first main driver, the first mirror driver, the first feedback circuit, the second main driver, the second mirror driver and the second feedback circuit.

Alternatively, the apparatus includes:

a first power supply which powers the first main driver, the first mirror driver, the first feedback circuit; and a second power supply which powers the second main driver, the second mirror driver and the second feedback circuit.

There is further provided, according to a preferred embodiment of the present invention, a method for generating a signal, including:

generating, in a main driver having a main circuit structure, a main output signal with alternating voltage, responsive to an alternating input signal;

providing a mirror driver, coupled to receive a direct voltage input and having a mirror circuit structure located in proximity to the main circuit structure;

generating a mirror output signal in the mirror circuit structure responsive to the direct voltage input such that a variation in an operating condition of the main driver causes a corresponding variation in the mirror output signal; and providing a feedback stabilization input to the main driver responsive to the mirror output signal so as to stabilize the main output signal.

Preferably, providing the feedback stabilization input includes providing a feedback amplifier which receives a swing control voltage and which varies the main output signal responsive thereto.

Preferably, the mirror circuit structure includes a plurality of mirror elements coupled in a substantially similar manner to a corresponding plurality of main elements comprised in the main circuit structure.

Preferably, the method includes:

supplying the alternating input voltage to the main driver from a main driver preamplifier;

supplying the direct voltage input to the mirror driver from a mirror driver preamplifier, and implementing the main driver preamplifier in a substantially similar environment to that of the mirror driver preamplifier, so that a variation in an operating condition of the main driver preamplifier causes a corresponding variation in the mirror output signal.

Further preferably, the main driver preamplifier includes a plurality of stages including a main power output stage, and the mirror driver preamplifier includes a mirror power output stage substantially similar in number of elements and coupling of the elements to the main power output stage.

Further preferably, providing the feedback stabilization includes coupling the main driver preamplifier to receive an overshoot feedback input so as to limit an overshoot in the main output signal.

Preferably, generating the main output signal includes generating signals comprising frequencies greater than approximately 1 GHz.

Preferably, generating the main output signal includes generating substantially rectangular signals having a transit time between an upper and a lower level less than approximately 200 ps.

Preferably, generating the main output signal includes generating substantially rectangular signals including an upper level and a lower level having an accuracy of the order of 10 mV or less.

Preferably, the main circuit structure includes a main differential pair of transistors, and the mirror circuit structure includes a mirror differential pair of transistors having substantially similar characteristics to the main differential pair of transistors.

Further preferably, the main differential pair of transistors include respective pluralities of transistors coupled in parallel, and the mirror circuit structure includes a non-differential transistor which is coupled in a substantially similar manner and which includes substantially similar characteristics to one of the plurality of transistors coupled in parallel.

Preferably, providing the mirror driver includes operating at least some elements of the mirror circuit structure in a substantially similar environment to that of at least some elements of the main circuit structure.

Further preferably, the environment includes a single chip.

The present invention will be more fully understood from the following detailed description of the preferred embodiments thereof, taken together with the drawings, in which:

DESCRIPTION OF PREFERRED EMBODIMENTS

Figure 2:
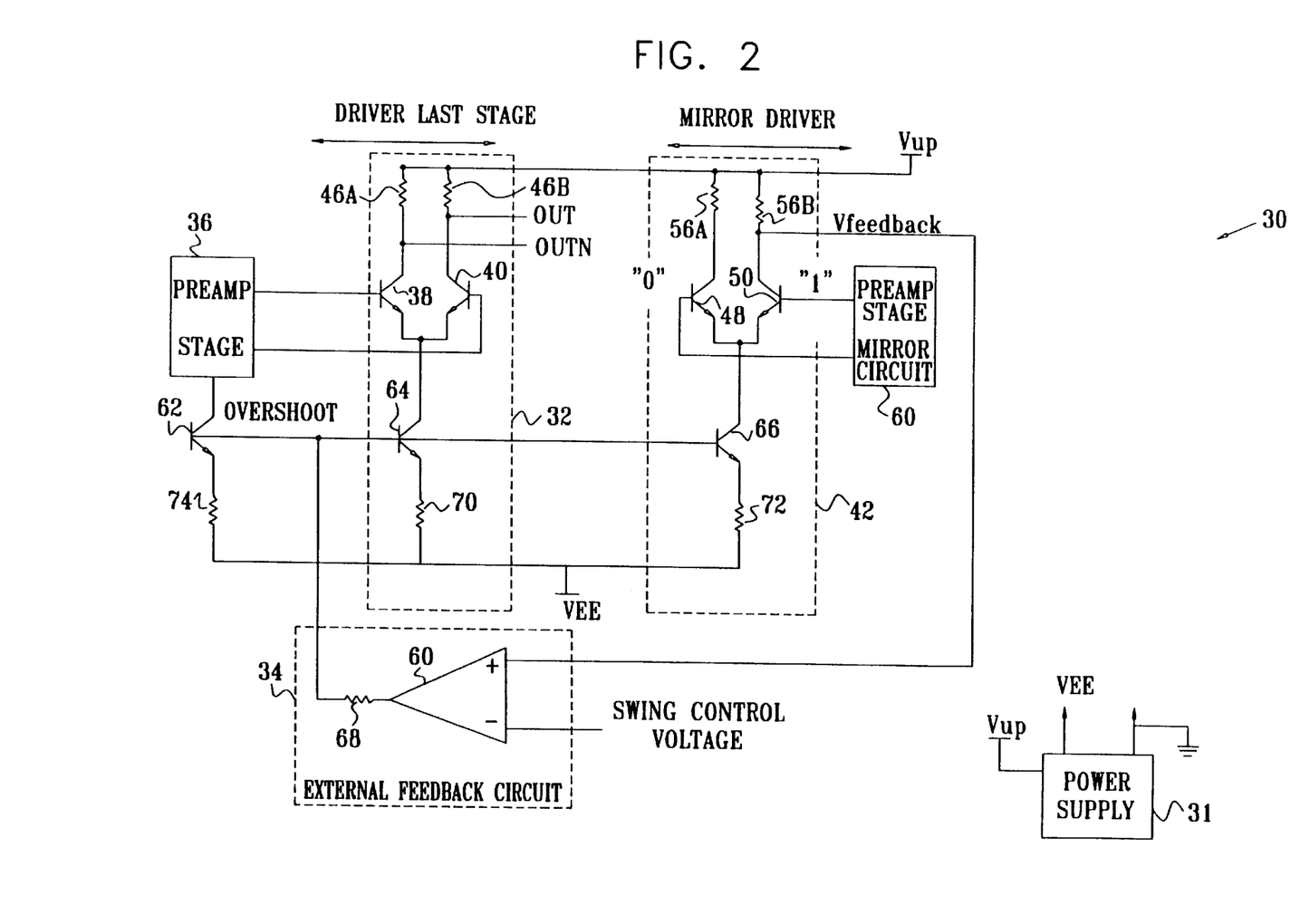
FIG. 2 is a schematic block diagram of an instrumentation driver, according to a preferred embodiment of the present invention.

Reference is now made to FIG. 2, which is a schematic block diagram of an instrumentation driver 30, according to a preferred embodiment of the present invention. Driver 30 comprises a main driver 32, a mirror driver 42, and an external feedback stabilizer circuit 34. Main driver 32 is implemented and operates generally as main driver 12, as described in the Background of the Invention, except for differences described hereinbelow. Thus, transistors 38, 40, and 64 correspond respectively to transistors 18, 20, and 26 of driver 12. Differential pair transistors 38 and 40 are coupled at their respective collectors to 50 ohm resistors 46A and 46B, which act as impedance matching resistors for respective signals OUTN and OUT. The OUT and OUTN signals are most preferably coupled to final receivers by 50 ohm impedance cables (for simplicity the cables and final receivers are not shown in FIG. 2). The collector of control transistor 64 is connected to the coupled emitters of transistors 38 and 40, and the emitter of transistor 64 is preferably connected via a series resistor 70 to a constant level Vee. Alternatively, the emitter of transistor 64 is connected directly to Vee.

Driver 30 is most preferably powered by a highly stable external power supply 31 having one terminal coupled to ground, and the other terminal supplying Vee. A variable supply Vup, provided by power supply 31, determines the required offset voltage for the "up" level of the generated signal. Most preferably, Vup has an accuracy of 1 mV. Typically the potential supplied by power supply 31 is of the order of 3.6±5% volts.

Active elements in driver 30 are most preferably implemented so as to be able to support rates of switching of alternating signals input to a preamplifier 36, described in detail with respect to FIG. 4 below. Preferably, the input signals alternate at a frequency of the order of 2.5 GHz, and the signals have rise/fall times of the order of 50–100 ps, in which case transistors described hereinabove in driver 30 are preferably implemented as bipolar silicon-germanium transistors. Resistors 46A and 46B are preferably implemented off-chip so as to achieve an accuracy of 1%. Other elements of driver 30 are preferably implemented on-chip, except where indicated otherwise hereinbelow.

Main driver 32 receives input signals from preamplifier 36. The input signals from the preamplifier are most preferably out of phase complementary rectangular signals, alternating between level 0 and level 1, which are input to the bases of transistors 38 and 40, thus generating corresponding alternating output signals OUT and OUTN. Signals OUT and OUTN will vary between a low level, corresponding to transistor 38 or 40 conducting, and a high level, corresponding to the transistors being cut off. It will be appreciated that the high voltage level is substantially the same as the high voltage level provided by power supply 31, Vup.

Mirror driver 42 is preferably implemented so that its physical components are substantially similar to, and are coupled in substantially the same manner as, those of driver 32. For example, a control transistor 66 "mirrors" control transistor 64, and a transistor 50 (one of a differential pair) mirrors transistor 40. The emitters of differential pair transistors 48 and 50, substantially similar to transistors 38 and 40, are coupled together. Similarly, transistors 48 and 50 are connected at their respective collectors to resistors 56A and 56B. Values for resistors 56A and 56B for preferred embodiments of the present invention are given below. A preamplifier 60, preferably substantially similar in construction to preamplifier 36, is coupled to respective gates of transistors 48 and 50. Alternatively, preamplifier 60 is implemented to have a generally similar output stage as preamplifier 36, so as to provide substantially similar output levels as preamplifier 36. The collector of control transistor 66 is connected to the coupled emitters of transistors 48 and 50, and the emitter of transistor 66 is preferably connected via a series resistor 72 to Vee. Alternatively, the emitter is connected directly to Vee.

In contrast to the input signals from preamplifier 36 to main driver 32, preamplifier 60 inputs constant level signals to the gates of transistors 48 and 50. The gate of transistor 48 receives a level 0 signal, and the gate of transistor 50 receives a level 1 signal. Thus transistor 48 is substantially cut-off, while transistor 50 conducts. An output Vfeedback is taken from the collector of conducting transistor 50, and is used as an input to stabilizer 34. It will be appreciated that Vfeedback corresponds to the low level output of transistors 38 and 40.

The collector of a preamplifier control transistor 62 is coupled to preamplifier 36, and current through the transistor generates a feedback current in the preamplifier which is used to limit signal overshoot in driver 32. The emitter of transistor 62 is preferably connected via a resistor 74 to Vee. Alternatively, the emitter is connected directly to Vee. The gates of all three control transistors 62, 64, and 66, are coupled together, and the three gates receive a feedback signal from external feedback stabilizer circuit 34.

External feedback stabilizer circuit 34 preferably comprises an operational amplifier 60 which receives Vfeedback at its non-inverting input. Alternatively, other types of external feedback circuits may be used in this context, including even a simple wire or conductor. The inverting input of amplifier 60 is supplied by an external DC control voltage which controls the voltage swing of outputs OUT and OUTN, as explained below. The output of amplifier 60 is fed via a current limiting resistor 68 to the gates of control transistors 62, 64, and 66.

During operation of driver 30, external feedback stabilizer circuit 34 acts to stabilize the output signals of main driver 32. Any changes within main driver 32, such as temperature changes, which intrinsically cause the output signals to change, will only be responded directly to by a circuit such as circuit 34 to a second order degree, or may not be responded to at all. However, since mirror driver 42 is in a feedback loop comprising circuit 34, any such changes will be reflected in the feedback provided by circuit 34. Thus, since mirror driver 42 is substantially similar to main driver 32 in construction and implementation, any changes causing current variation in driver 32 appear as substantially similar variations in mirror driver 42, and these changes are incorporated in the feedback loop.

It will be appreciated that driver 30 operates by mirror driver 42 behaving with a substantially similar electrical response as main driver 32. Typically, each transistor 38, 40, and 64 of main driver 32 is respectively implemented as substantially similar parallel transistors, in order to increase the current carrying capacity of the respective transistors. For example, each of transistors 38, 40, and 64, is implemented as six transistors in parallel. In this case mirror driver 42 may be implemented so each transistor 48, 50, and 66, is also implemented as six transistors in parallel. Alternatively, each mirror driver transistor may be implemented as a different number, most preferably fewer than six, of substantially similar transistors as those of main driver 32. Further alternatively or additionally, areas of emitters of transistors in mirror driver 42 are set to be different from areas of emitters of the corresponding transistors of main driver 32. Since transistor 48 is substantially cut-off during operation of driver 30, in some preferred embodiments of the present invention, transistor 48 and its collector resistor 56A are not implemented. Alternatively, transistor 48 is implemented and its collector is coupled directly to ground.

The values of each resistor 56A (when implemented), 56B, and 72 are most preferably adjusted so that the current density, i.e., current/emitter area, via corresponding paths of driver 32 and mirror driver 42 are substantially similar. For example, if transistors 38, 40, and 64, each have total emitter areas of $A_e$, then areas of corresponding transistors 48, 50, and 66 may be set to each have emitter areas of $A_e/N$, where N is any convenient number. In this case, resistor values in main driver 32 and mirror driver 42 are adjusted accordingly. For example, if resistors 46A and 46B have value R, and resistor 72 has value $R_e$, then values for resistors 56A, 56B, and 70 are set to be substantially equal to R.N, R.N, and $R_e/N$ respectively, in order to equalize the gain and current density in respective transistors fed by the resistors. Resistors 56A (when implemented) and 56B are preferably implemented off-chip so as to achieve high accuracies.

Figure 3:
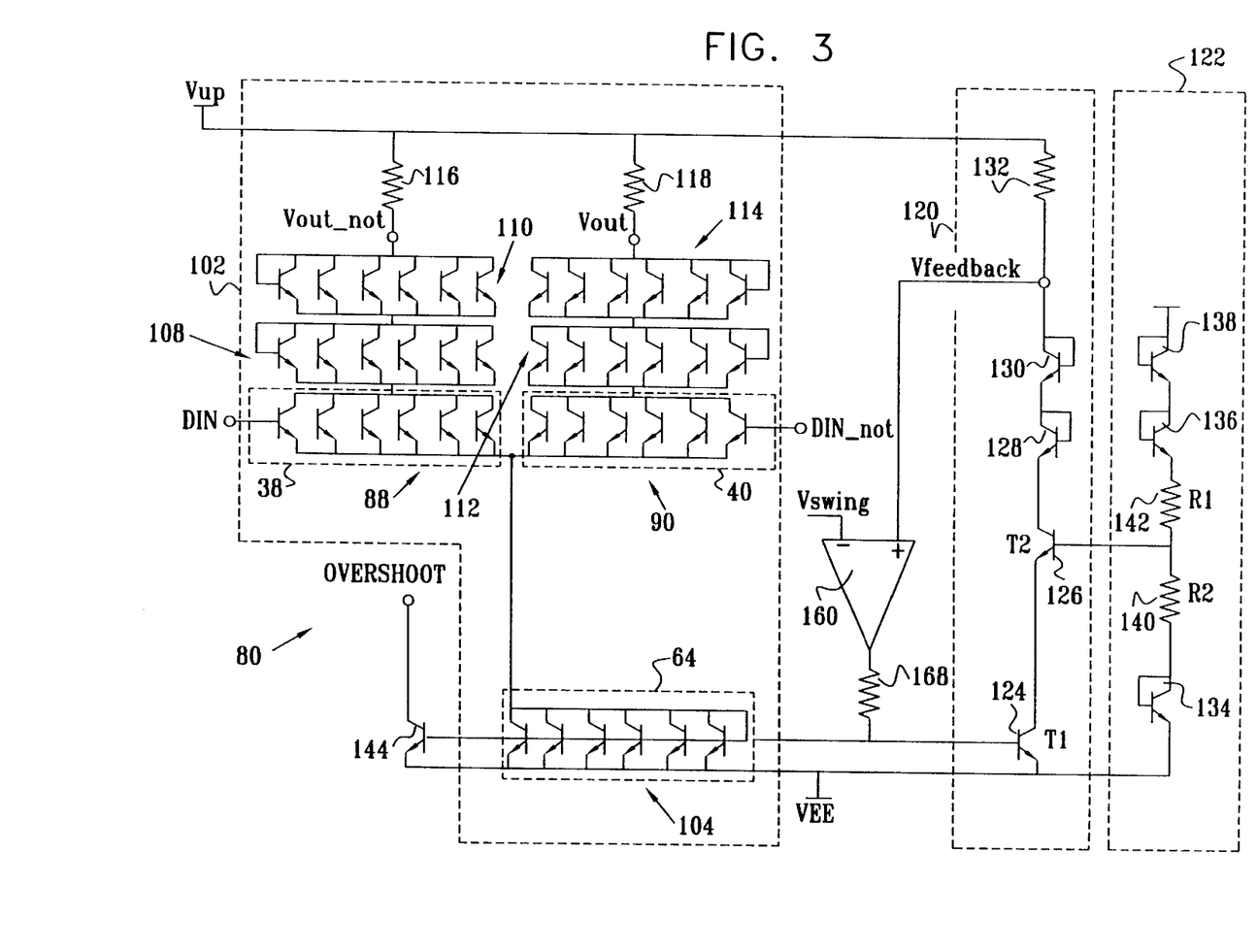
FIG. 3 is a schematic electronic diagram of an alternative instrumentation driver, according to a preferred embodiment of the present invention.

FIG. 3 is a schematic electronic diagram of an instrumentation driver 80, according to an alternative preferred embodiment of the present invention. Driver 80 is of generally the same form as driver 30, and in FIG. 3 elements having substantially the same function as those of driver 30 are indicated by the same numerals. Except where otherwise indicated hereinbelow, elements of driver 80 are most preferably implemented on-chip. Thus, transistor 38 is implemented as six substantially similar parallel connected transistors 88, transistor 40 is implemented as six substantially similar parallel connected transistors 90, and transistor 64 is implemented as six substantially similar parallel connected transistors 104. Transistors 88, 90, and 104, are active elements in a main driver 102, which corresponds to main driver 32 of driver 30.

A first plurality of six parallel diodes 108 is connected in series with a second plurality of six parallel diodes 110. Diodes 108 are connected in series with the collectors of transistors 88. Similarly, a third plurality of six parallel diodes 112 is connected in series with a fourth plurality of six parallel diodes 114. Diodes 112 are connected in series with the collectors of transistors 90. Diodes 108, 110, 112, and 114, most preferably formed from transistors by shorting emitters to collectors, serve as breakdown protection diodes by reducing the collector-emitter voltage of transistors 88 and 90. Diodes 110 are connected to the variable supply Vup via an off-chip 50 ohm resistor 116, and diodes 114 are connected to Vup via an off-chip 50 ohm resistor 118.

In main driver 102 input signals are received from preamplifier 36 at the gates of transistors 88 and transistors 90. Output signal OUT is taken from the junction of resistor 118 and diodes 114, and output signal OUTN is taken from the junction of resistor 116 and diodes 110.

Driver 80 comprises a mirror driver circuit 120 and a preamplifier stage mirror circuit 122, corresponding respectively to mirror driver 42 and preamplifier 60. Mirror driver circuit 120 comprises four transistors 124, 126, 128, and 130, coupled in series. Transistor 124 and non-differential transistor 126 respectively mirror one of the plurality of transistors 104 and one of the plurality of differential pair transistors 90. Transistors 128 and 130 each have their gates shorted to their collectors, and respectively mirror one of the plurality of diodes 112 and one of the plurality of diodes 114. An off-chip resistor 132 is connected from ground to the shorted collector of transistor 130, and the Vfeedback signal is taken from the junction of resistor 132 and transistor 130. Resistor 132 is most preferably set to a value six times the value of resistor 118, i.e., 300 ohms, so that the current in transistors 124 and 126 substantially corresponds to the current in one of transistors 90 and one of transistors 104.

In operation, non-differential transistor 126 is consistently biased "on," mirroring one of differential pair transistors 90 or transistors 89 in their on state, by preamplifier 122. Mirror driver 120 does not include another transistor mirroring transistors 90 or 88, since such a transistor would be consistently biased "off" to mirror the off state of transistors 90 and 88, and so would generate a level substantially equal to ground.

Preamplifier mirror circuit 122 comprises three transistors 134, 136, and 138, and two resistors 140 and 142, coupled in series. The transistors and resistors of preamplifier 122 substantially mirror elements of an output stage of preamplifier 36, but comprise adjustments in values to the resistors to accommodate the fact that, as described below, there are six transistors corresponding to transistor 134 in preamplifier 36. Thus, resistors 140 and 142 are most preferably set at values of 120 ohms each, and act as a voltage dividing network corresponding to a voltage dividing network of preamplifier 36.

Driver 80 further comprises a preamplifier control transistor 144, corresponding to transistor 62 of driver 30. The collector of transistor 144 is connected to preamplifier 36, and the emitter of the transistor is coupled to Vee.

The bases of transistor 144, transistors 104, and transistor 124 are connected together, as for the corresponding transistors in driver 30. The coupled bases receive a feedback signal from an operational amplifier 160 via a current limiting resistor 168. Amplifier 160 and resistor 168 are preferably implemented as off-chip components. Alternatively amplifier 160 is implemented on-chip, in which case it is most preferably constructed from a combination of field effect and bipolar transistors, as is known in the art. Amplifier 160 is coupled its non-inverting input to the Vfeedback signal generated at the junction of transistor 130 and resistor 132. The inverting input of amplifier 160 is coupled to an external DC control voltage that determines the required swing. As for driver 30, the DC voltage sets the size of the output voltage swing at the junction of resistor 118 and diodes 114, and at the junction of resistor 116 and diodes 110.

Figure 4:
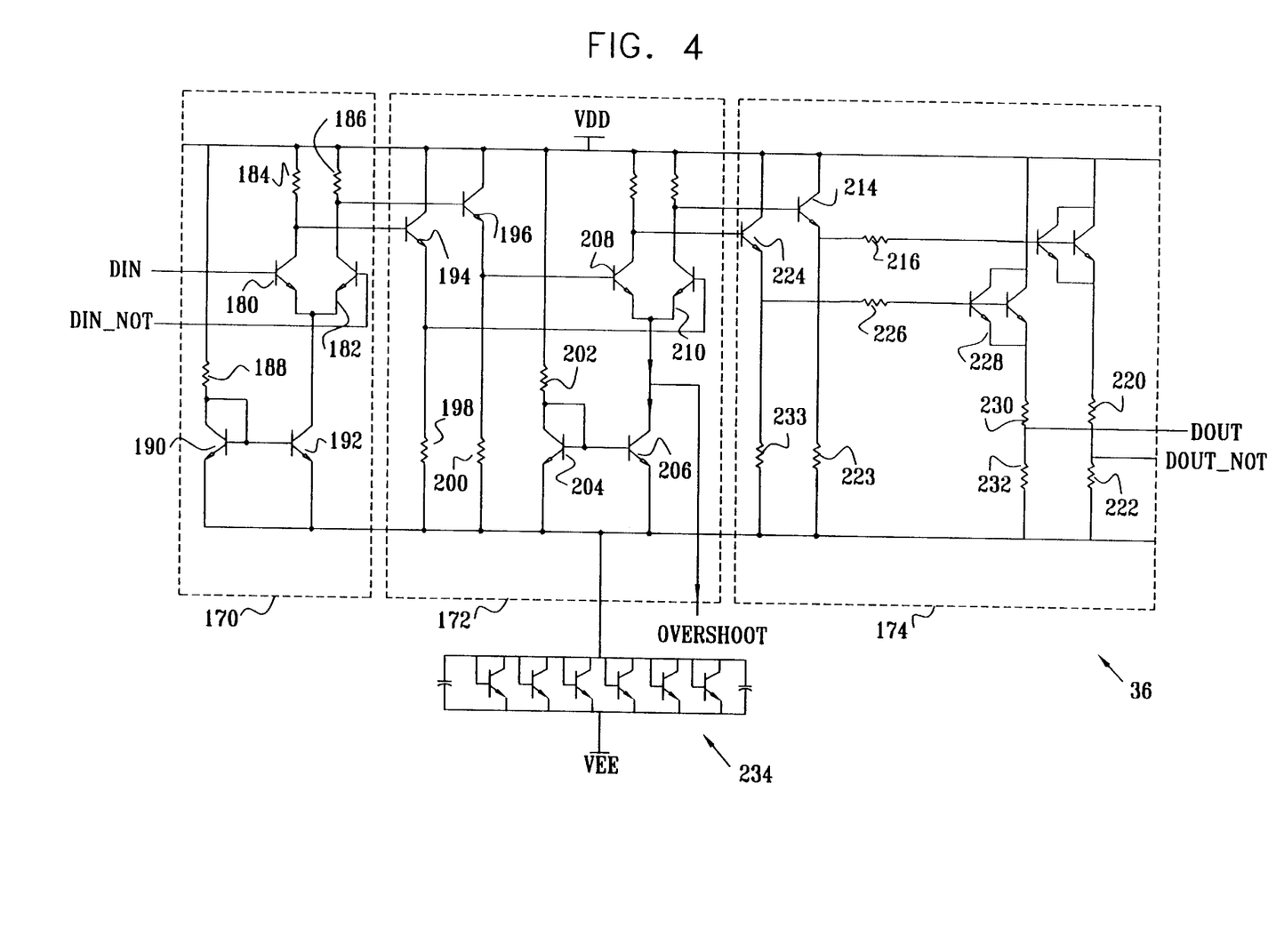
FIG. 4 is a schematic electronic diagram of an instrumentation driver preamplifier, according to a preferred embodiment of the present invention.

FIG. 4 is a schematic electronic diagram of preamplifier 36, according to a preferred embodiment of the present invention. Preamplifier 36 comprises an input buffer stage 170, a swing modification stage 172, and a power output stage 174. Input stage 170 comprises a differential pair of transistors 180 and 182, which receive at their gates rectangular input signals. Current through the coupled emitters of transistors 180 and 182 is controlled by a control transistor 192. Transistor 192 is in turn controlled by its base being coupled to the junction of a resistor 188 connected to a diode 190 (in the form or a transistor with collector and emitter shorted). The collectors of transistors 180 and 182 are respectively connected to substantially equal resistors 184 and 186, and outputs of stage 170 are taken from the collectors.

Swing modification stage 172 changes the swing of the signal fed to stage 174. Stage 172 receives the outputs from stage 170 at emitter follower transistors 194 and 196, connected respectively to emitter resistors 198 and 200, and transfers the buffered signals derived from the transistors to the bases of differential pair transistors 208 and 210 respectively. The collector of a transistor 206 is coupled to the emitters of transistors 203 and 210, and transistor 206 and a transistor 204 and a resistor 202 have similar functions to, and are connected as, transistors 192 and 190 and resistor 188 described above. Most preferably, the junction of the collector of transistor 206 and the emitters of the differential pair transistors is coupled to transistor 62 of driver 30, or to transistor 144 of driver 80, so as to receive overshoot feedback from the respective transistor. In each case, the overshoot signal is used to control differential transistors 208 and 210 so as to limit the overshoot.

Stage 174 comprises a pair of substantially similar emitter follower stages. Each emitter follower stage is used to buffer the respective output of stage 172 and also to suppress ranging at the output of the preamplifier. A first emitter follower stage comprises a transistor 214, resistors 216 and 223, transistors 218, and a voltage divider formed from resistors 220 and 222. Resistors 220 and 222 most preferably have values of approximately 20 ohms. The voltage divider is introduced to suppress ringing at the output, which is taken from the junction of resistors 220 and 222, and to reduce the output impedance to approximately 11 ohms. A second emitter follower stage comprises a transistor 224, resistors 226 and 233, transistors 228, and a voltage divider formed from resistors 230 and 232. Components of the second emitter stage perform substantially tasks and have substantially the same values as the corresponding components of the first stage.

Six transistors 234 have their respective bases and collectors connected so as to form six parallel diodes. The diodes reduce the voltage across stages 170, 172, and 174 to approximately 2.7 V, so that the current drawn by the emitter followers of stage 174 is correspondingly reduced.

Returning to FIG. 3, preamplifier mirror circuit 122 is implemented to reflect one of the emitter follower stages of stage 174, when the emitter follower stage is in high level ouptut condition. Thus transistor 134 corresponds to transistors 234, and transistors 136 and 138 correspond respectively to transistors 218 and 214.

Also, resistors 142 and 140 correspond to resistors 220 and 222 respectively. It will be appreciated that the differences in values between the resistors in preamplifier 122 and stage 174 reflect the different currents carried by the preamplifier and stage 174.

Figure 5A:
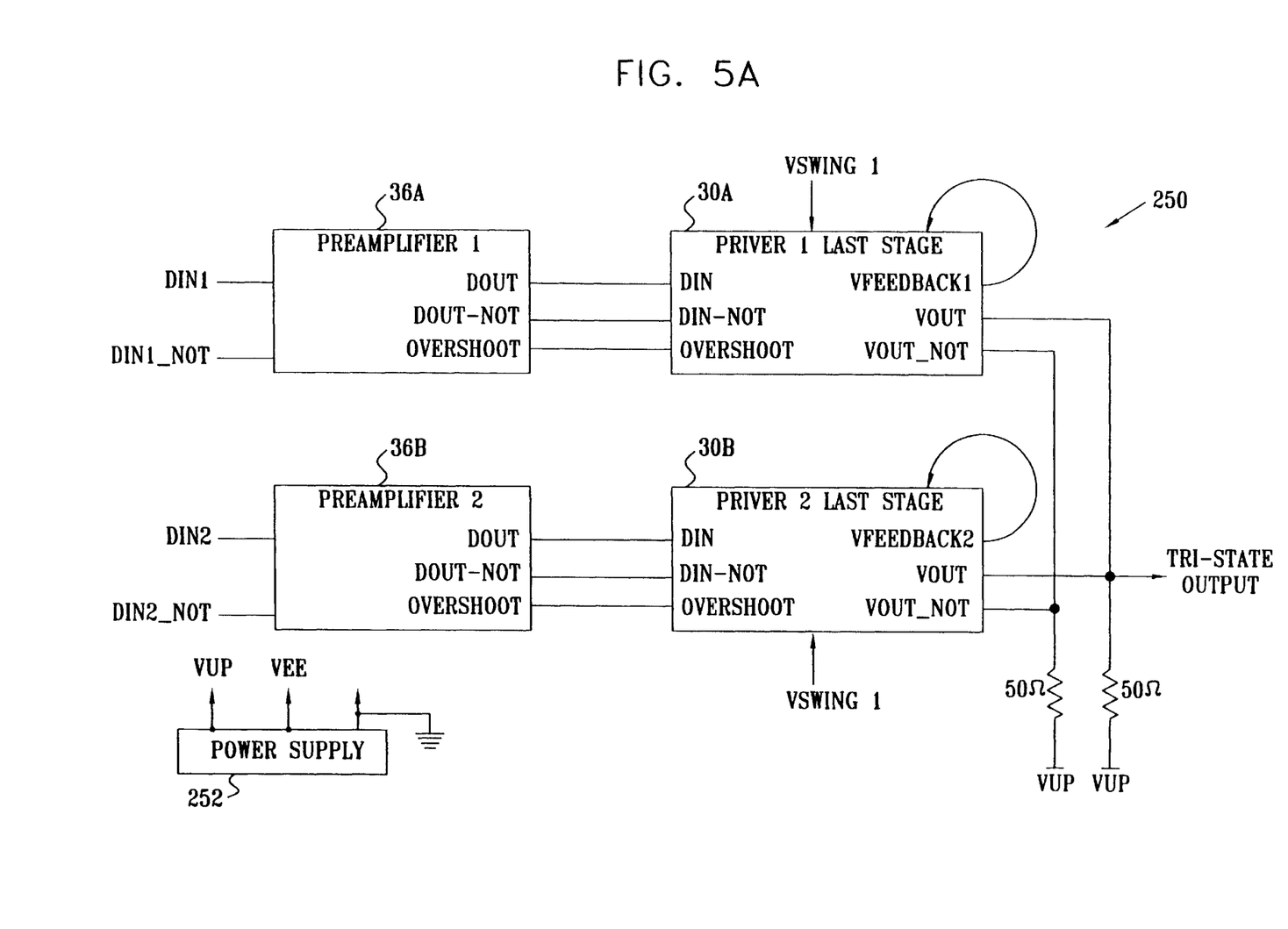
FIG. 5A is a schematic block diagram showing a tri-level instrumentation driver, according to a preferred embodiment of the present invention.
Figure 5B:
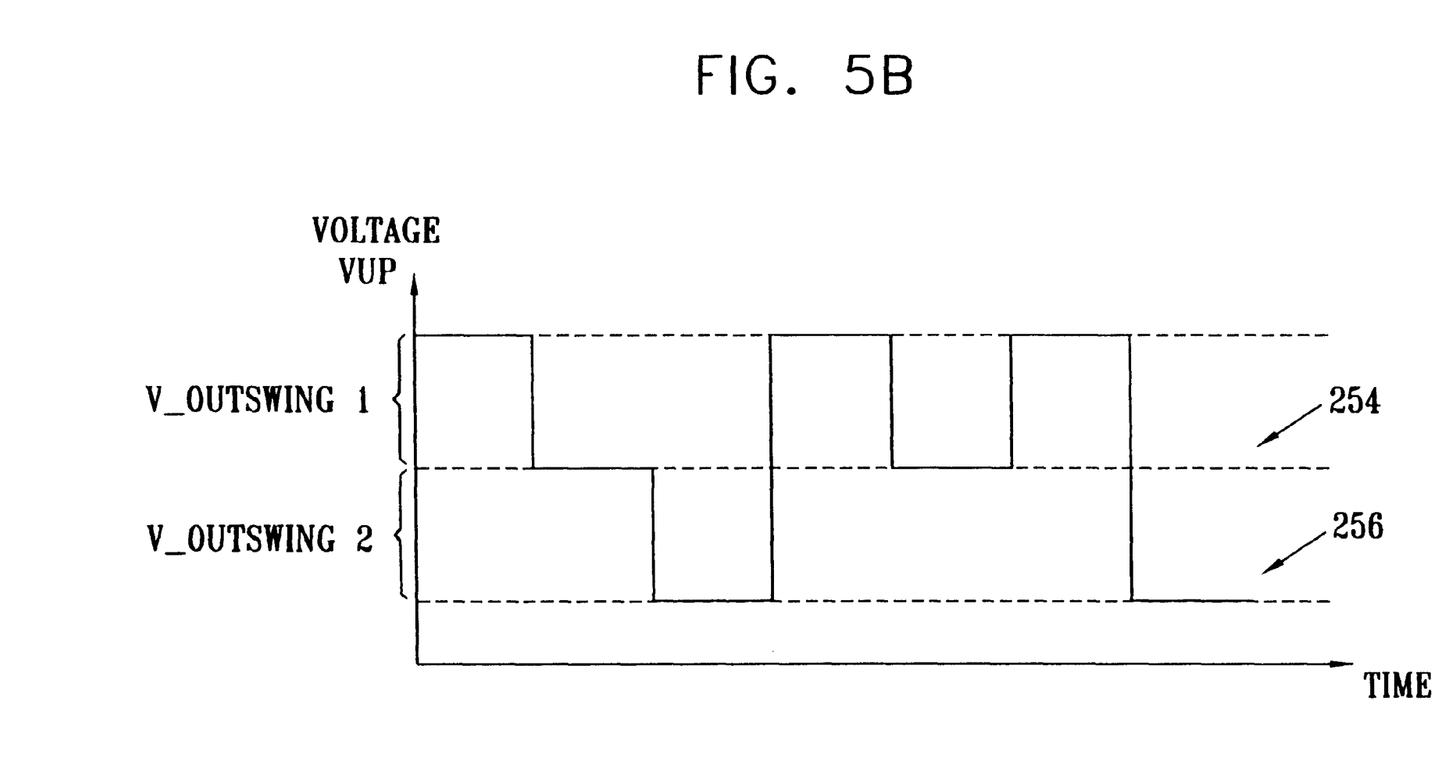
FIG. 5B is a schematic graph of an example of output from the instrumentation driver of FIG. 5A, according to a preferred embodiment of the present invention.

FIG. 5A s a schematic block diagram showing a tri-level instrumentation driver 250, and FIG. 5B is a schematic graph of an example of output from instrumentation driver 250, according to a preferred embodiment of the present invention. Instrumentation driver 250 comprises a first driver 30A and a second driver 30B, which are substantially similar to instrumentation driver 30 described hereinabove, and which are independent of each other. Drivers 30A and 30B are respectively supplied by a first preamplifier 36A and a second preamplifier 36B, which are substantially similar to preamplifier 36 described hereinabove, and which operate independently. Preamplifier 36A and preamplifier 36B in turn receive separate alternating voltage inputs Din1 and Din1_not, and Din2 and Din2_not, respectively. Most preferably, driver 30A comprises a preamplifier mirror circuit which mirrors preamplifier 36A and driver 30B comprises a preamplifier mirror circuit which mirrors preamplifier 36B, as described above for preamplifier mirror circuit 60. Preferably, a power supply 252 supplies drivers 30A and 30B and preamplifiers 36A and 36B. Alternatively, power supply 252 is split so as to power driver 30A with preamplifier 36A, and driver 30B with preamplifier 36B, separately.

Driver 30A receives an input voltage swing level Vswing1 which sets an output swing voltage level of V_outswing1. Similarly, driver 30B receives an input voltage swing level Vswing2 which sets an output swing voltage level of V_outswing2. Vout of driver 30A is connected to Vout of driver 30B, effectively as a parallel output connection. Since the drivers are independent, the output swings generated by each driver are independent. Thus the output is a tri-state output voltage varying between an upper level Vup, a first level 254, and a second level 256. First level 254 is separated from Vup by adjustable swing V_outswing1. Second level 256 is separated from first level 256 by adjustable swing V_swing2. Driver 250 enables each of the tri-state levels to be determined to an accuracy of about 5 mV, each level being set within a window of approximately 0 V to 3 V. It will be appreciated that a similar output to that described hereinabove can be achieved if the outputs are connected in series.

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. Instrumentation driver apparatus, comprising:
a main driver, coupled to receive an alternating input signal and having a main circuit structure, which is adapted to generate, responsive to the alternating input signal, a main output signal with alternating voltage;
a mirror driver, coupled to receive a direct current (DC) voltage input and having a mirror circuit structure, and adapted to generate a mirror output signal responsive to the DC voltage input, the mirror circuit structure being located such that a variation in an operating condition of the main driver causes a corresponding variation in the mirror output signal;
a feedback circuit, coupled to receive the mirror output signal and to provide, responsive thereto, a feedback stabilization input to the main driver so as to stabilize the main output signal;
a main driver preamplifier which supplies the alternating input voltage to the main driver; and
a mirror driver preamplifier which supplies the direct voltage input to the mirror driver, wherein the main driver preamplifier is implemented in a substantially similar environment to that of the mirror driver preamplifier, such that a variation in an operating condition of the main driver preamplifier causes a corresponding variation in the mirror output signal.

2. Apparatus according to claim 1, wherein the main driver preamplifier comprises a plurality of stages including a main power output stage, and the mirror driver preamplifier comprises a mirror power output stage substantially similar in number of elements and coupling of the elements to the main power output stage.

3. Apparatus according to claim 1, wherein the mirror driver preamplifier comprises a plurality of mirror elements coupled in a substantially similar manner to coupling of a corresponding plurality of main elements comprised in the main driver preamplifier.

4. Apparatus according to claim 1, wherein the main driver preamplifier is coupled to receive an overshoot feedback input in order to limit an overshoot in the main output signal.

5. Instrumentation driver apparatus, comprising:
a main driver, coupled to receive an alternating input signal and having a main circuit structure, which is adapted to generate, responsive to the alternating input signal, a main output signal with alternating voltage, and wherein the main circuit structure comprises a main differential pair of transistors which provide the main output signal at a collector of one of the main differential pair of transistors;
a mirror driver, coupled to receive a direct current (DC) voltage input and having a mirror circuit structure, and adapted to generate a mirror output signal responsive to the DC voltage input, the mirror circuit structure being located such that a variation in an operating condition of the main driver causes a corresponding variation in the mirror output signal; and a feedback circuit, coupled to receive the mirror output signal and to provide, responsive thereto, a feedback stabilization input to the main driver so as to stabilize the main output signal.

6. Apparatus according to claim 5, wherein the mirror circuit structure comprises a mirror differential pair of transistors having substantially similar characteristics to the main differential pair of transistors.

7. Instrumentation driver apparatus, comprising:
a main driver, coupled to receive an alternating input signal and having a main circuit structure, which is adapted to generate, responsive to the alternating input signal, a main output signal with alternating voltage, and wherein the main circuit structure comprises a plurality of first transistors coupled in parallel and a plurality of second transistors coupled in parallel, the two pluralities acting as a main differential pair of transistors which provides the main output signal at a collector of one of the main differential pair of transistors;
a mirror driver, coupled to receive a direct current (DC) voltage input and having a mirror circuit structure, and adapted to generate a mirror output signal responsive to the DC voltage input, the mirror circuit structure being located such that a variation in an operating condition of the main driver causes a corresponding variation in the mirror output signal; and a feedback circuit, coupled to receive the mirror output signal and to provide, responsive thereto, a feedback stabilization input to the main driver so as to stabilize the main output signal.

8. Apparatus according to claim 7, wherein the mirror circuit structure comprises a third transistor which is coupled in a substantially similar manner and which has substantially similar characteristics to one of the plurality of first transistors coupled in parallel.

9. Instrumentation driver apparatus, comprising:
a first main driver, coupled to receive a first alternating input signal and having a first main circuit structure, which is adapted to generate, responsive to the first alternating input signal, a first main output signal with alternating voltage;
a first mirror driver, coupled to receive a first direct current (DC) voltage input and having a first mirror circuit structure, and adapted to generate a first mirror output signal responsive to the first DC voltage input, the first mirror structure being located such that a variation in an operating condition of the first main driver causes a corresponding variation in the first mirror output signal;
a first feedback circuit, coupled to receive the first mirror output signal and to provide, responsive thereto, a first feedback stabilization input to the first main driver so as to stabilize the first main output signal;
a second main driver, coupled to receive a second alternating input signal and having a second main circuit structure substantially similar to the first main circuit structure, which is adapted to generate, responsive to the second alternating input signal, a second main output signal with alternating voltage;
a second mirror driver, coupled to receive a second DC voltage input and having a second mirror circuit structure substantially similar to the first mirror circuit structure, and adapted to generate a second mirror output signal responsive to the second DC voltage input, the second mirror structure being located such that a variation in an operating condition of the second main driver causes a corresponding variation in the second mirror output signal; and
a second feedback circuit, coupled to receive the second mirror output signal and to provide, responsive thereto, a second feedback stabilization input to the second main driver so as to stabilize the second main output signal, so that the first main driver, the first mirror driver, and the first feedback circuit, are electrically independent of the second main driver, the second mirror driver, and the second feedback circuit, and so that the first main output signal and the second main output signal are combined to form a tri-level output.

10. Apparatus according to claim 9, and comprising a power supply which powers the first main driver, the first mirror driver, the first feedback circuit, the second main driver, the second mirror driver and the second feedback circuit.

11. Apparatus according to claim 9, and comprising:
a first power supply which powers the first main driver, the first mirror driver, the first feedback circuit; and
a second power supply which powers the second main driver, the second mirror driver and the second feedback circuit.

12. A method for generating a signal, comprising:
generating, in a main driver having a main circuit structure, a main output signal with alternating voltage, responsive to an alternating input signal;
providing a mirror driver, coupled to receive a direct current (DC) voltage input and having a mirror circuit structure located such that a variation in an operating condition of the main driver causes a corresponding variation in a mirror output signal;
generating the mirror output signal in the mirror circuit structure responsive to the DC voltage input;
providing a feedback stabilization input to the main driver responsive to the mirror output signal so as to stabilize the main output signal;
supplying the alternating input voltage to the main driver from a main driver preamplifier;
supplying the direct voltage input to the mirror driver from a mirror driver preamplifier, and
implementing the main driver preamplifier in a substantially similar environment to that of the mirror driver preamplifier, so that a variation in an operating condition of the main driver preamplifier causes a corresponding variation in the mirror output signal.

13. A method according to claim 12, wherein the main driver preamplifier comprises a plurality of stages including a main power output stage, and the mirror driver preamplifier comprises a mirror power output stage substantially similar in number of elements and coupling of the elements to the main power output stage.

14. A method according to claim 12, wherein providing the feedback stabilization comprises coupling the main driver preamplifier to receive an overshoot feedback input so as to limit an overshoot in the main output signal.

15. A method for generating a signal, comprising:
generating, in a main driver having a main circuit structure, a main output signal with alternating voltage, responsive to an alternating input signal, wherein the main circuit structure comprises a main differential pair of transistors;
providing a mirror driver, coupled to receive a direct current (DC) voltage input and having a mirror circuit structure located such that a variation in an operating condition of the main driver causes a corresponding variation in a mirror output signal, wherein the mirror circuit structure comprises a mirror differential pair of transistors having substantially similar characteristics to the main differential pair of transistors;
generating the mirror output signal in the mirror circuit structure responsive to the DC voltage input; and
providing a feedback stabilization input to the main driver responsive to the mirror output signal so as to stabilize the main output signal.

16. A method for generating a signal, comprising:
generating, in a main driver having a main circuit structure, a main output signal with alternating voltage, responsive to an alternating input signal, wherein the main circuit structure comprises a plurality of first transistors coupled in parallel and a plurality of second transistors coupled in parallel, the two pluralities acting as a main differential pair of transistors which provides the main output signal at a collector of one of the main differential pair of transistors;
providing a mirror driver, coupled to receive a direct current (DC) voltage input and having a mirror circuit structure located such that a variation in an operating condition of the main driver causes a corresponding variation in a mirror output signal, and wherein the mirror circuit structure comprises a third transistor which is coupled in a substantially similar manner and which comprises substantially similar characteristics to one of the plurality of first transistors coupled in parallel;
generating the mirror output signal in the mirror circuit structure responsive to the DC voltage input; and
providing a feedback stabilization input to the main driver responsive to the mirror output signal so as to stabilize the main output signal.

* * * * *